United States Patent [19]

Takayama

[11] 4,403,349

[45] Sep. 6, 1983

[54] INTERMEDIATE FREQUENCY DETECTION CIRCUIT

[75] Inventor: Kazuo Takayama, Kobe, Japan

[73] Assignee: Fujitsu Ten Limited, Hyogo, Japan

[21] Appl. No.: 179,288

[22] PCT Filed: Apr. 4, 1979

[86] PCT No.: PCT/JP79/00083

§ 371 Date: Dec. 5, 1979

§ 102(e) Date: Dec. 5, 1979

[87] PCT Pub. No.: WO79/00937

PCT Pub. Date: Nov. 15, 1979

[30] Foreign Application Priority Data

Apr. 17, 1978 [JP] Japan .................................. 53-45149

[51] Int. Cl.³ .......................... H04B 1/10; H04B 1/26
[52] U.S. Cl. .................................. 455/219; 455/154; 455/205
[58] Field of Search ............... 455/219, 225, 226, 232, 455/234, 239, 240, 244, 160, 164, 192, 200, 154, 205, 224, 295, 296; 324/79 R

[56] References Cited

U.S. PATENT DOCUMENTS

| 3,569,840 | 3/1971 | Tanaka | 455/219 |
| 3,995,220 | 11/1976 | Hansen | 455/225 |
| 4,322,857 | 3/1982 | Grohmann | 455/226 |

FOREIGN PATENT DOCUMENTS 53-17212  2/1978  Japan .................................. 455/219

Primary Examiner—Tommy P. Chin
Attorney, Agent, or Firm—Oblon, Fisher, Spivak, McClelland & Maier

[57] ABSTRACT

An intermediate frequency detection circuit of a superheterodyne type radio receiver is disclosure which includes a logic circuit inputted with a signal indicating the level of an intermediate frequency output and a signal indicating the level of a high frequency output of the receiver. This logic circuit generates a indication of the reception of a broadcasting wave when the intermediate frequency output is high and the high frequency output is low. This intermediate frequency detection circuit avoids the erroneous detection due to spurious signals and likewise renders the pulse width of the detection signal approximately constant thus making this circuit suitable for use with automatic channel selection.

4 Claims, 10 Drawing Figures

INTERMEDIATE FREQUENCY DETECTION CIRCUIT

BACKGROUND OF THE INVENTION

1. Field of the Invention

This invention concerns an intermediate frequency detection circuit of a radio receiver which is ensured to generate an output indicative of the reception for broadcasting waves with no erroneous operations caused by suprious signals or the like.

2. Description of the Prior Art

Electronic tuning type radio receivers capable of automatic search channel selection or the like recognize the tuning to a broadcasting wave when an intermediate frequency stage generates an output. The frequency sweeping is then interrupted and a receiving state is entered. The intermediate frequency stage generates its output by the reception not only of broadcasting waves but also of harmonic waves (sprious signals) thereof to interrupt the channel selection operation. A circuit for taking out the intermediate frequency output for channel selection (hereinafter referred to as IF detection circuit) is, desirably, designed so that it produces no output upon reception of the harmonic waves or noises. Moreover, while the IF detection circuit is adapted to monitor the output from the intermediate frequency stage at a certain threshold level and generates an output when the intermediate frequency output exceeds this level, this system results in a problem that a frequency width exceeding the threshold level changes depending on the level of the input signals. If the frequency width becomes broader exact tuning is of course made difficult. It is, accordingly, desired for the IF detection circuit to output a narrow width pulse at an exact tuning point.

SUMMARY OF THE INVENTION

It is, accordingly, an object of this invention to provide an F detection circuit capable of satisfying the aforesaid requirements with a simple circuit structure. According to this invention there is provided a first circuit for producing a signal indicating the output level of an intermediate frequency stage of a superheterodyne type radio receiver, a second circuit for producing a signal indicating the output level of a high frequency stage of the above receiver and a logic circuit to which the outputs from the above first and second circuits are inputted. The logic circuit generates a signal indicating the reception of a broadcasting wave when the intermediate frequency output is high and the high frequency output is low. According to this system, erroneous operation does not result from noises or spurious signals and thus search channel selection is not interrupted. Also this system provides an advantage of easy exact tuning since a detection signal with an approximately constant pulse width is obtainable.

The signal indicating the output level of the intermediate frequency stage is, simply, obtained from an AGC (Automatic Gain Control) circuit. Since a time constant in the AGC circuit is relatively large, particularly, in an AM receiver, a problem arises that the signal indicating the output level of the intermediate frequency can not be obtained rapidly. In view of the above, a switching circuit is provided by this invention, which decreases the time constant of the AGC circuit during channel selection.

Other objects and advantages of this invention will become apparent from the following explanations referring to the accompanying drawings.

DETAILED DESCRIPTION OF THE PREFERRED EMBODIMENTS

Figure 1:
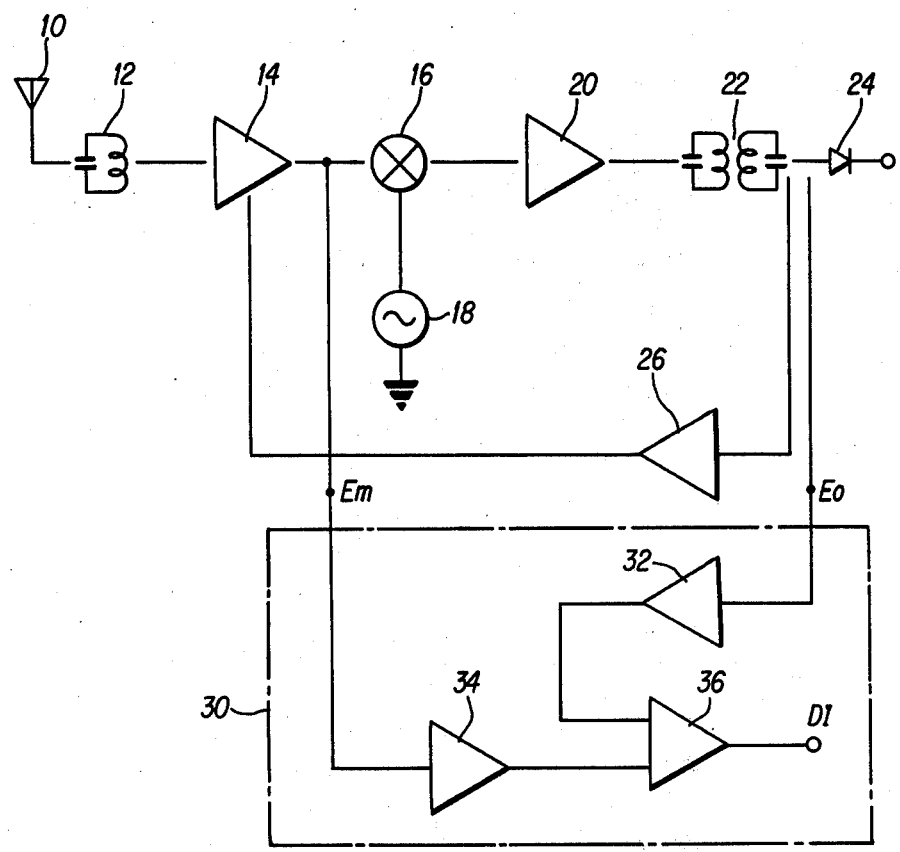
FIG. 1 is a block diagram showing a basic embodiment of this invention.

Referring to FIG. 1, there is shown an antenna 10, a tuning circuit 12, a high frequency amplifier 14, a frequency mixer 16, a local oscillator 18, an intermediate frequency amplifier 20, an intermediate frequency transformer 22, a detector 24 and an AGC circuit 26, which constitute a well known tuner section in a superheterodyne type radio receiver. In case of electronic tuning, voltage-dependent variable capacitance elements such as varactor diode are used as capacitors in the tuning circuit 12 or the like, and channel selection is made by the change in the capacitance value by varying the voltage applied to the above elements to thereby change the resonance frequency. Reference numeral 30 represents an IF detection circuit according to this invention, which consists of detectors 32, 34 for each of the levels of intermediate frequency and high frequency and a logic circuit 36.

The operation of the IF detection is to be described. When a broadcasting wave enters to the antenna 10 and the tuner is tuned thereto, the intermediate frequency transformer 22 produces an IF output. If the IF output is used as it is for the interruption of the frequency sweeping, erroneous operation may possibly be resulted as described previously since the IF output is generated by the reception not only of a broadcasting wave but also of its harmonic waves, as well as noises contained in a broad band area, that is, in the same frequency range as that of the broadcasting wave. By the way, the IF output, if caused by the harmonic waves, has a feature that the output Em produced then from the high frequency stage is abnormally high. This has been specifically described in Japanese Patent Application No. 99766/1977 and can be summerized as below. The gain of the high frequency stage is controlled so that the intermediate frequency output becomes approximately constant in an AGC-controlled receiver. Accordingly, assuming the ratio of the amplitude of the harmonic wave to the foundamental wave as 1/K (where K>1), the gain of the high frequency stage if tuned to the harmonic wave becomes K times as great as the gain when tuned to the foundamental wave. Since the output Em from the high frequency stage also contains the foundamental wave, the foundamental wave is increased by the factor of K as compared with the usual case to render the output Em abnormally high. It is the same when the tuner responses to the noises. Erroneous detection for the broadcasting wave reception caused by the harmonic waves and broad band noises can be inhibited simply by utilizing the above phenomenon. The logic circuit 36 is used for this purpose and it has a logic function of generating an IF detection output DI where an IF output Eo is high thus causing the intermediate frequency level detector 32 to produce an output and a high frequency stage output Em is low thus causing the high frequency level detector 34 to produce no output, and generating no such IF detection output DI where the detector 32 produces no output or when the detector 32 produces an output but the detector 34 also produces an output.

For the level check of the IF output $E_o$, while an additional IF output level detector may be provided, the voltage of the AGC circuit may, advantageously, be utilized since it has a value depending on the IF output $E_o$. The voltage relations in each of the sections are to be detailed with respect to the later case.

Figure 2:
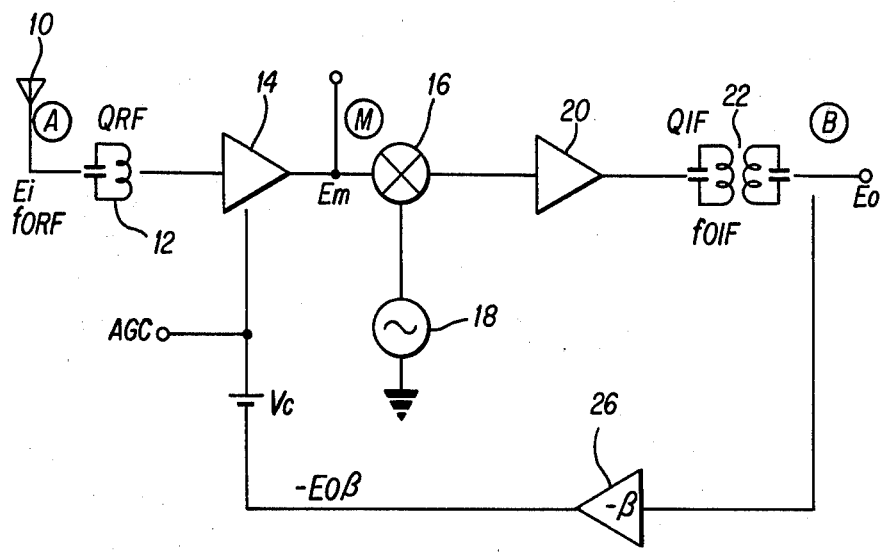
FIG. 2 is a block diagram for explaining the states of voltages in each of the sections.

FIG. 2 shows the tune section of a radio receiver as in FIG. 1, in which the tuner has one single tuned stage before the mixer 16 and one double tuned stage behind the mixer 16, the AGC circuit 26 produces an output $-\beta E_o$ in proportion to the IF output $E_o$ and the high frequency amplifier 14 has a gain in proportion to a difference voltage between the above voltage and a constant voltage Vc ($V_{AGC}=Vc-E_o\beta$) while subjected to AGC (automatic gain control) due to the difference voltage. At first, the ratio of a peak level $A_{to}$ near the resonance point to a level $A_t$ detuned with $\Delta f$: $|A_t|/|A_{to}|$ is represented by the equation (1) for the single tuning and by the equation (2) for the double tuning:

$$\frac{|A_t|}{|A_{to}|} = \left\{ 1 + \left( Q\frac{\Delta f}{f_0} \right)^2 \right\}^{-\frac{1}{2}} \quad (1)$$

$$\frac{|A_t|}{|A_{to}|} = \left\{ 1 + \left( Q\frac{\Delta f\sqrt{2}}{f_0} \right)^4 \right\}^{-\frac{1}{2}} \quad (2)$$

wherein $f_o$ is a center (resonance point) frequency and Q is a quality factor of the resonance circuit. For the double tuned resonance circuit 22, it is assumed that Q for the two coils is equal and the circuit is in a critical coupling. Then, assuming the gain between the antenna input terminal Ⓐ and the high frequency amplifier output terminal Ⓜ as $G_{1max}$, and the gain between the above output terminal Ⓜ and the tuner output terminal Ⓑ as $G_{2max}$, the tuner output voltage $E_o$ to a signal detuned by $\Delta f$ from the tuning frequency of the tuner is represented by the following equation:

$$E_0 = EiG_{1max}\left\{ 1 + \left( Q_{RF}\frac{\Delta f}{f_{0RF}} \right)^2 \right\}^{-\frac{1}{2}} \cdot G_{2max}\left\{ 1 + \left( Q_{IF}\frac{\Delta f\sqrt{2}}{f_{0IF}} \right)^4 \right\}^{-\frac{1}{2}} \quad (3)$$

where $Q_{RF}$ and $Q_{IF}$ represent Q for the coils in each of the high frequency stage and the intermediate frequency stage respectively and $f_{0RF}$ and $f_{0IF}$ represent center frequencies of the same. From the above assumption, since the gain $G_{1max}$ is represented as:

$$G_{1max} = (Vc - E_o\beta)R \quad (4)$$

where R is a conversion constant, the following equation was obtained from the equations (3) and (4).

$$E_0 = Ei\frac{VcRG_{2max}}{\sqrt{\left\{ 1 + \left( Q_{IF}\frac{\Delta f\sqrt{2}}{f_{0IF}} \right)^4 \right\}\left\{ 1 + \left( Q_{RF}\frac{\Delta f}{f_{0RF}} \right)^2 \right\}} + Ei\beta RG_{2max}} \quad (5)$$

In addition, from the equation:

$$E_m = \frac{E_0\sqrt{\left\{ 1 + \left( Q_{IF}\frac{\Delta f\sqrt{2}}{f_{0IF}} \right)^4 \right\}}}{G_{2max}} \quad (6)$$

the following equation is obtained:

$$E_m = \frac{VcR\sqrt{\left\{ 1 + \left( Q_{IF}\frac{\Delta f\sqrt{2}}{f_{0IF}} \right)^4 \right\}}}{\sqrt{\left\{ 1 + \left( Q_{IF}\frac{\Delta f\sqrt{2}}{f_{0IF}} \right)^4 \right\}\left\{ 1 + \left( Q_{RF}\frac{\Delta f}{f_{0RF}} \right)^2 \right\}} + Ei\beta RG_{2\,max}} \quad (7)$$

Figure 3:
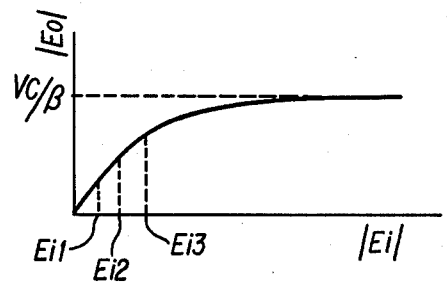
FIG. 3–FIG. 8 are graphs for explaining the characteristics or waveforms of signals in each of the sections.
Figure 4:
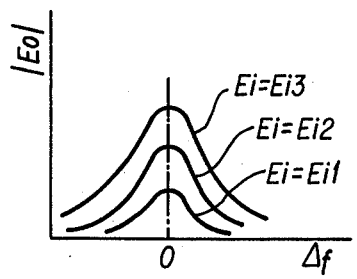
Figure 5:
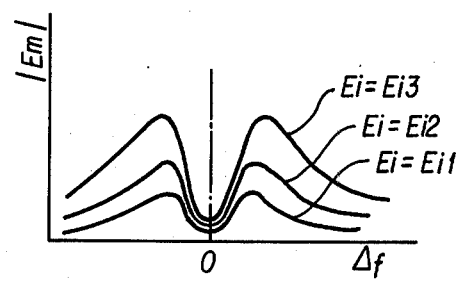
Figure 6:
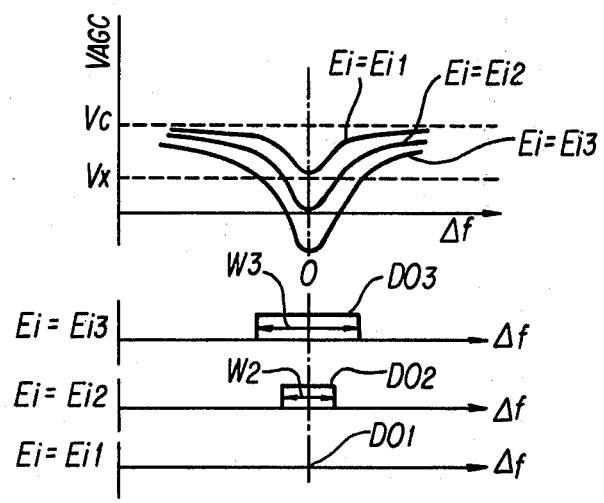

The outlined forms of the function curve for Eo and Em relative to Ei and $\Delta f$ given by the above equations (5) and (7) are as shown in FIG. 3–FIG. 5. FIG. 3 shows the relation of the IF output Eo relative to the input voltage Ei, and FIG. 4 and FIG. 5 show the relations of the output voltages $E_o$ and Em relative to the detuning degree $\Delta f$. $Ei_1$–$Ei_3$ are values for the input voltage Ei as shown in FIG. 3 and the curves Em—$\Delta f$ are concaved at $\Delta f=0$ by the influence of AGC. The AGC voltage waveforms are as shown in FIG. 6. As can be seen from FIG. 6, since the AGC voltage $V_{AGC}$ forms peaks at $\Delta f=0$, the reception of broadcasting waves can be detected therewith. Since the level of the voltage $V_{AGC}$ is, however, changed depending on the input level, the detection signal varies as $DO_1$, $DO_2$, $DO_3$ *when the input level Ei changes as* $Ei_1$, $Ei_2$, $Ei_3$ for a predetermined threshold level Vx, whereby the detection signal is absent at $Ei=Ei_1$ and the detection signal is present at $Ei=Ei_2$ or $Ei_3$, and the width of the detection signal is $W_2$ and $W_3$ for the input levels $Ei_2$ and $Ei_3$ respectively. The above difference in the width $W_2$, $W_3$ means the difference in the detection frequency width, which causes a difficulty in the exact tuning. In addition, detection signal is generated also for the suprious signals.

Figure 7:
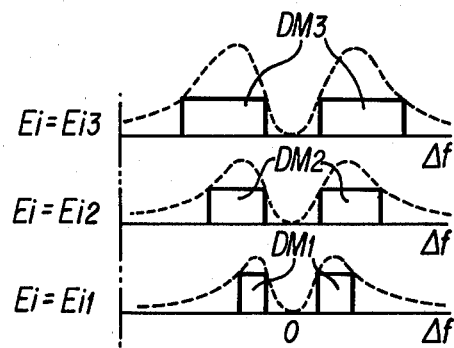
Figures 8A, 8B:
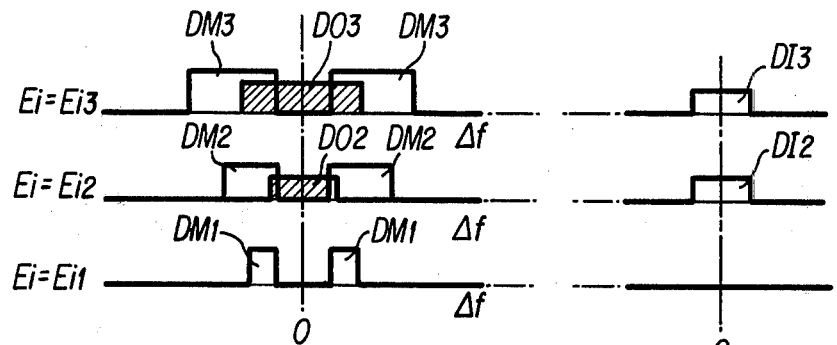

In view of the above, erroneous detection is prevented and the width of the detection signal is rendered constant by utilizing the output Em from the high frequency stage as well in this invention. By slicing the output Em shown in FIG. 5 at a certain level and shaping it, detection signals $DM_1$-$DM_3$ shown in FIG. 7 are obtained. These signals are discrete in the vicinity of $\Delta f = 0$ as shown in the figure and the width of the depleted portions are approximately constant irrespective of the input levels. Consequently, the frequency width of the IF detection output can be rendered constant as apparent from FIG. 8 by adapting such that the IF detection output is generated when the AGC level $V_{AGC}$ is below the level Vx and the level detector for detecting the output Em by the above certain level produces no output signal. In FIG. 8, (a) represents the IF detection signals $DO_2$, $DO_3$ and the high frequency detection signals $DM_1$-$DM_3$ relative to the frequency deviation $\Delta f$ and (b) represents the IF detection outputs $DI_2$, $DI_3$ obtained through the above logic function. Specifically, outputs are present at the reception of broadcasting waves but absent at the reception of the suprious signals and the broad band noises, and IF detection signal outputs with an approximately constant frequency width are obtainable by obtaining the level information from the AGC voltage $V_{AGC}$ and the frequency information from the high frequency stage output.

Figure 10:
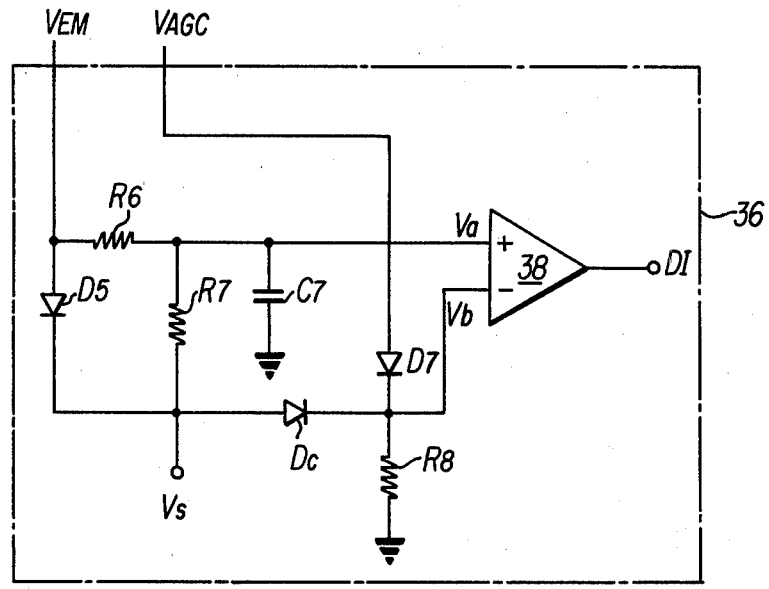
FIG. 10 is a schematic circuit diagram showing a modification for a part of the circuit in FIG. 9.
Figure 9:
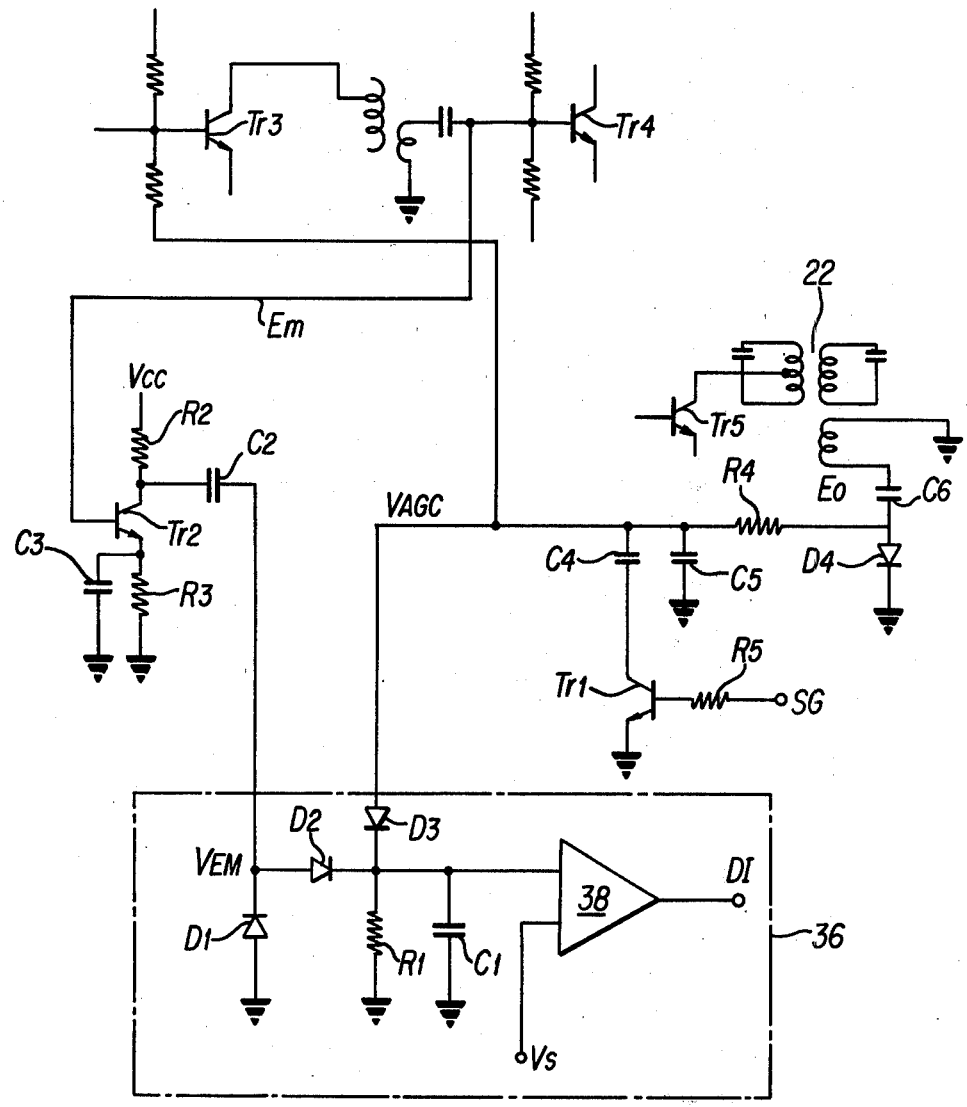
FIG. 9 is a schematic circuit diagram showing a specific emodiment of this invention.

Specific embodiments of this invention are to be shown in FIG. 9 and FIG. 10. In FIG. 9, there is shown an amplifying transistor $Tr_3$ for the high frequency stage 14, a transistor $Tr_4$ for the mixer 16 and a transistor $Tr_5$ for the intermediate frequency stage 20. The output Em from the high frequency stage is taken out from the input terminal of the mixer 16, amplified through an amplifying circuit consisting of a transistor $Tr_2$, resistors $R_2$, $R_3$ and a capacitor $C_3$ and detected by a capacitor $C_2$ and a detecting diode $D_1$ to produce a DC voltage $V_{EM}$ corresponding to the high frequency stage output Em. A capacitor $C_6$, a diode $D_4$, a resistor $R_4$ and a capacitor $C_5$ form an AGC circuit, which produces the foregoing AGC voltage $V_{AGC}$. Diodes, $D_2$, $D_3$ and a resistor $R_1$ compare the voltage $V_{AGC}$ with the voltage $V_{EM}$ to take out a higher voltage of them. A capacitor $C_1$ is for smoothing use. A comparator 38 is applied to one of its terminals with a reference voltage Vs for determining the threshold level and to the other of its terminals with the voltage $V_{AGC}$ or $V_{EM}$.

Referring then to the generation of the IF detection output DI, a voltage $V_{AGC}-V_{D3}$ ($V_{D3}$ is a forward voltage drop along the diode $D_3$) is usually applied to the input terminal of the comparator 38. Since the voltage is higher than the reference voltage Vs, the comparator 38 produces no output. If the IF output $E_o$ becomes higher by the reception of the broadcasting waves or the likes, the voltage $V_{AGC}-V_{D3}$ goes lower than Vs causing the comparators 38 to generate the output DI. The output is, however, generated only when the output Em is low, and the comparator 38 generates no output DI where the high frequency stage output Em is high such as by the input of the suprious signals or the broad band noises and $\Delta f$ detuning since the voltage $V_{EM}-V_{D2}$ ($V_{D2}$ is a voltage drop along the diode $D_2$) is inputted to the comparator 38 and it is not lower than the reference voltage Vs.

A transistor $Tr_1$ is used for switching the time constant in the AGC circuit, which is turned ON and OFF upon input to its base of a control signal such as a signal SG that takes an H (high) level during reception and turns to an L (low) level during searching, and connects the capacitor $C_4$ in parallel with the capacitor $C_3$ in the ON state to increase the time constant. On the other hand, transistor $Tr_1$ disconnects the capacitor $C_4$ from the capacitor $C_3$ in the OFF state to decrease the time constant. This switching action is important in an AM tuner. While a somewhat greater time constant is provided to the AGC circuit so as not to suppress the modulation components in the AM tuner, the voltage $V_{AGC}$ can not be obtained rapidly unless the response speed of the AGC circuit is increased, to bring about the foregoing difficulty in the IF detection.

The logic circuit 36 surrounded by a dotted line in FIG. 9 may alternatively be formed as shown in FIG. 10. In this figure, a diode $D_5$, resistors $R_6$, $R_7$ and a capacitor $C_7$ prepare a voltage Va formed by subtracting from the reference voltage Vs a DC voltage corresponding to the level of the output Em, and diodes $D_6$, $D_7$, and a resistor $R_8$ prepare a voltage Vb usually at a value of $V_{AGC}-V_{D7}$ and restricted not to be lower than $Vs-V_{D6}$. $V_{D6}$, $V_{D7}$ represent forward voltage drops along the diodes $D_6$, $D_7$ respectively. The IF detection operation is described below. Usually, voltage Va is approximately the same as the voltage Vs and, when the voltage $Vb=V_{AGC}-V_{D7}$ goes lower than the voltage Va upon reception of a broadcasting wave or the like, the comparator 38 generates the output DI. If the output level Em is increased by the reception of the suprious signals or the likes, however, the voltage Va goes lower than Vs, where the relation Va>Vb is not satisfied even if the intermediate frequency output is increased to lower Vb, and the comparator 38 generates no output DI. The relation Va>Vb is neither satisfied upon frequency detuning by $\Delta f$. The present circuit can thus be free from erroneous operation and generate the detection outputs with a constant width.

Further for the purpose of restricting the lower limit of the voltage Vb, the circuit is provided with a diode $D_6$, registor $R_8$ and is applied with voltage Vs as illustrated. The reasons are as follows. Since the state in which the voltage Va is lower than the voltage Vs to some extent can be considered abnormal, it is desired in such a case to avoid the generation of the IF detection how the intermediate frequency output is high. Then, the voltage Vb is restricted so as not to be lower than $Vs-V_{D6}$, by which the IF detection output is kept from generation if the high frequency stage output Em is abnormally high.

While this invention has been described with regard to the illustrated embodiments, this invention is now no way restricted only to such embodiments and various modifications are possible within the scope of the claim.

What is claimed is:

1. An intermediate frequency detection circuit for generating an intermediate frequency detection output indicating the reception of a broadcasting wave in a superheterodyne type radio receiver having an intermediate frequency stage and a high frequency stage, said detection circuit comprises:

a first circuit for producing a signal indicating the output level of said intermediate frequency stage of said radio receiver;

a second circuit for producing a signal indicating the output level of said high frequency stage in said radio receiver; and a logic circuit whose input is connected to the output of said first and second circuits, said logic circuit having an output to provide said detection output when the output of said intermediate frequency stage is high and the output of said high frequency stage is low.

2. The intermediate frequency detection circuit as defined in claim 1, wherein said first circuit comprises an automatic gain control circuit for providing an automatic gain voltage of said receiver, wherein said second circuit comprises a detection circuit for detecting the output of said high frequency stage, and wherein said logic circuit for generating the detection output comprises a comparator having one of its inputs connected to a reference voltage and a selection means whose input is connected to the outputs of said first and second circuits and whose output is connected to the other input of said comparator whereby said selection means applies to said comparator the higher one of the outputs from said first and second circuits.

3. The intermediate frequency detection circuit as defined in claim 1 wherein said first circuit comprises an automatic gain control for providing an automatic gain control voltage of said receiver, wherein said second circuit comprises a detection circuit for detecting the output of said high frequency stage, and wherein said logic circuit for generating the detection output comprises a comparator having one of its inputs connected to the output of said first circuit, a subtraction circuit whose inputs are connected to the outputs of said second circuit and a reference voltage and wherein the output of said subtraction circuit is connected to the other input of said comparator.

4. The intermediate frequency detection circuit as defined in claim 2 or 3, wherein said first circuit further comprises a switching circuit for adjusting the time constant of said automatic gain control such that the time constant is smaller during the search channel selection operation of said receiver than during the reception operation of said receiver.

* * * * *

UNITED STATES PATENT AND TRADEMARK OFFICE
CERTIFICATE OF CORRECTION

PATENT NO. : 4,403,349

DATED : SPETEMBER 6, 1983

INVENTOR(S) : KAZUO TAKAYAMA

It is certified that error appears in the above-identified patent and that said Letters Patent is hereby corrected as shown below:

In column 1, line 12, delete "suprious" and insert --spurious--;

In column 1, line 21, delete "sprious" and insert --spurious--;

In column 1, line 41, delete "F" and insert --IF--;

In column 2, line 51, delete "summerized" and insert --summarized--;

In column 2, line 56, delete "foundamental" and insert --fundamental--;

In column 2, line 61, in both occurences, delete "foundamental" and insert --fundamental--;

UNITED STATES PATENT AND TRADEMARK OFFICE
CERTIFICATE OF CORRECTION

PATENT NO. : 4,403,349
DATED : SEPTEMBER 6, 1983
INVENTOR(S) : KAZUO TAKAYAMA

It is certified that error appears in the above-identified patent and that said Letters Patent is hereby corrected as shown below:

In column 4, lines 65 and 66, please change the sub-script writing to conform with rest of patent --when the input level Ei changes as $Ei_1$,--;

In columns 4 and 5, lines 68 and 1, please change the sub-script writing to conform with rest of patent --or $Ei_3$,--;

In column 5, line 6, delete "suprious" and insert --spurious--;

In column 5, line 29, delete "suprious" and insert --spurious--;

UNITED STATES PATENT AND TRADEMARK OFFICE
CERTIFICATE OF CORRECTION

PATENT NO. : 4,403,349

DATED : SEPTEMBER 6, 1983

INVENTOR(S) : KAZUO TAKAYAMA

It is certified that error appears in the above-identified patent and that said Letters Patent is hereby corrected as shown below:

In column 5, line 67, delete "suprious" and insert --spurious--;

In column 6, line 36 and 37, delete "suprious" and insert --spurious--.

Signed and Sealed this

Twelfth Day of June 1984

[SEAL]

Attest:

GERALD J. MOSSINGHOFF

Attesting Officer

Commissioner of Patents and Trademarks